(12) United States Patent
Byun

(10) Patent No.: US 6,171,981 B1
(45) Date of Patent: Jan. 9, 2001

(54) ELECTRODE PASSIVATION LAYER OF SEMICONDUCTOR DEVICE AND METHOD FOR FORMING THE SAME

(75) Inventor: Jeong Soo Byun, Chungcheongbuk-do (KR)

(73) Assignee: LG Semicon Co., Ltd., Chungcheongbuk-do (KR)

( * ) Notice: Under 35 U.S.C. 154(b), the term of this patent shall be extended for 0 days.

(21) Appl. No.: 09/045,820

(22) Filed: Mar. 23, 1998

(30) Foreign Application Priority Data

Sep. 11, 1997 (KR) .................................................. 97-46809

(51) Int. Cl.$^7$ .......................... H01L 21/31; H01L 21/469
(52) U.S. Cl. .......................... 438/785; 438/396; 438/790
(58) Field of Search .......................... 438/26, 958, 106, 438/104, 38, 593, 785, 396, 240, 253

(56) References Cited

U.S. PATENT DOCUMENTS

| | | | |
|---|---|---|---|
| 5,094,981 | * | 3/1992 | Chung et al. .......................... 438/190 |
| 5,795,833 | * | 8/1998 | Yu et al. .......................... 438/763 |
| 5,888,588 | * | 3/1999 | Nagabushnam et al. ............ 438/592 |
| 5,897,354 | * | 4/1999 | Kachelmeier .......................... 438/264 |
| 5,981,367 | * | 11/1999 | Gonzalez .......................... 438/593 |

FOREIGN PATENT DOCUMENTS 62-149122 * 7/1987 (JP) .............................. H10L/21/265

OTHER PUBLICATIONS

Wolf, Silicon Processing for the VLSI Era, vol. 2, Process Integration, pp. 273–275, Lattice Press, 1990.*

* cited by examiner

*Primary Examiner*—Matthew Smith
*Assistant Examiner*—Calvin Lee

(57) ABSTRACT

An electrode passivation layer of a semiconductor device and a method for forming the same having improved corrosion-resistance and oxidation-resistance are disclosed, the electrode passivation film including a semiconductor substrate; a conductive layer pattern formed on the semiconductor substrate; and an amorphous passivation film formed on the conductive layer pattern.

35 Claims, 7 Drawing Sheets

ELECTRODE PASSIVATION LAYER OF SEMICONDUCTOR DEVICE AND METHOD FOR FORMING THE SAME

BACKGROUND OF THE INVENTION

1. Field of the Invention

The present invention relates to an electrode passivation layer of a semiconductor device and a method for forming the same and, more particularly, to an electrode passivation layer of a semiconductor device having improved corrosion-resistance and oxidation-resistance and a method for forming the same.

2. Discussion of the Related Art

Electrode wiring technology in a MOS (Metal Oxide Semiconductor) device is divided into aluminum wires connecting gate electrodes, source/drain impurity diffusion regions, contact holes, and cells.

In scaling, the characteristic of electrode wires is affected by the sizes of devices and the 1/K reduction of power supply voltage. Regarding gate electrodes, increasing a resistance by K times results in the increase of signal transmission delay time, thereby decreasing the speed of device operation. Regarding contact holes, resistance is increased by $K^2$ times and current density is increased by K times, thereby deteriorating the reliability of wires. Regarding wires, resistance is increased by K times and current density is increased by K times, thereby deteriorating the reliability of wiring by electromigration.

Since the material for a gate electrode is used for both the gate electrode and identical wires forming word lines of a memory, the material should have a low resistivity. In particular, as design is being submicronized, RC delays are being increased based on increases in wiring resistance R caused by miniaturization and increases in capacitance caused by reduction in wire pitch.

For instance, if the polysilicon used as gate electrode is also used for a design standard with lines that are less than 1 μm wide, the reliability and operation speed become inferior. These effects follow because resistivity of doped polysilicon is bigger than 200 μΩ/cm. Therefore, in order to reduce the resistance, a $WSi_x$ film (refracting silicide) having a good step coverage and a resistivity of about 100 μΩ/cm is deposited on polysilicon to be used as an electrode. That is, polysilicide (polysilicon+refractory silicide) is used as an electrode. However, as described previously, it is known that a $WSi_x$ having a resistivity of about 100 μΩ/cm loses its effectiveness if the electrode is designed with lines having a width of less than 0.5 μm.

In order to solve this problem, active research and development has been conducted using tungsten W having a resistivity of less than 10 μΩ/cm, $TiSi_2$ having a resistivity of less than 20 μΩ/cm, $COSi_2$ having a resistivity of less than 20 μΩ/cm, and TiN having a resistivity of 30 μΩ/cm. In addition, a process for forming a passivation film corresponding to the process for forming an electrode using the aforementioned material of wires is essential. That is, the technology for forming a passivation film is necessary to achieve the improved characteristic of a device by subjecting the surface of a semiconductor device to a certain type of treatment and high reliability by restraining the fluctuation for a long term. As it were, this technology is a defensive one. But recently, it is necessitated to positively improve the total level of process.

The technology necessary to form a passivation film is subdivided into three classifications: interfacial protection, wire protection, and pad protection. Silicon oxide and silicon nitride are mainly used to form various insulating film and glass layers in their temperature ranges.

In particular, a wire passivation film should experience limited reactions to metal, adhere well to surface, block the effects of moisture and contamination, experience few mechanical flaws such as cracks or pinholes, be resilient to damage, and have good processing characteristics. Above all, it should have a good stability and no deformation.

A conventional method for forming an electrode of a semiconductor device will be described with reference to the accompanying drawings.

FIGS. 1A to 1D are cross-sectional views showing process steps of a conventional method for forming an electrode of a semiconductor device.

Figure 1A:
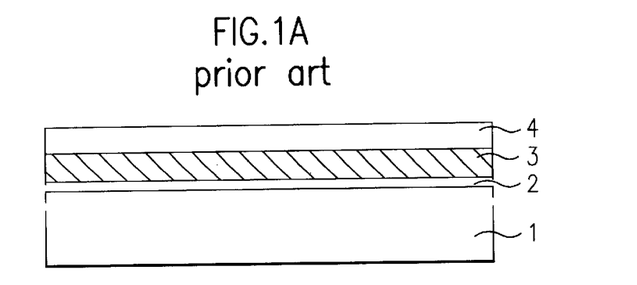
FIGS. 1A to 1D are cross-sectional views showing process steps of a conventional method for forming an electrode of a semiconductor device.

Referring initially to FIG. 1A, a gate oxide film 2, a doped polysilicon layer 3, and a $WSi_x$ film 4 are successively formed on a semiconductor substrate 1. The polysilicon layer 3 is doped with B, P, As, and so forth. After forming the doped polysilicon layer 3, a cleaning process using HF is performed over the entire surface and then a chemical reaction using $WF_6+SiH_2Cl_2$, thereby forming a silicide film.

Figure 1B:
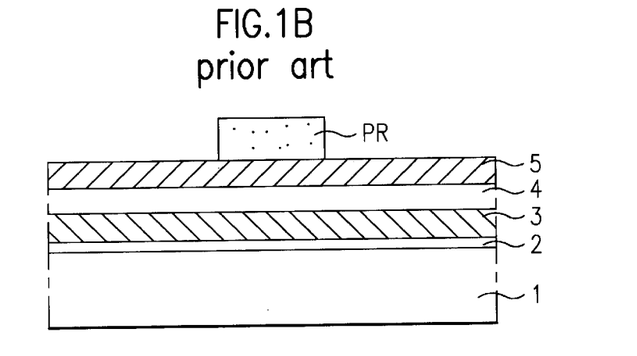

Referring to FIG. 1B, a cap oxide film 5 is formed on the $WSi_x$ film 4. Next, a photoresist film PR is coated on the entire surface of the cap oxide film 5. The photoresist film PR is subjected to an exposure and development process to define a gate electrode region over only the gate electrodes.

Figure 1C:
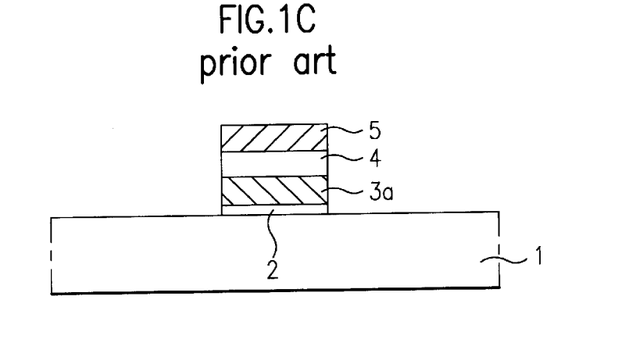

Referring to FIG. 1C, using the patterned photoresist film PR as a mask, the cap oxide film 5, the $WSi_x$ film 4, the doped polysilicon layer 3 and the gate oxide film 2 are successively etched, thus forming a gate electrode 3a. Thereafter, an annealing process is performed on the entire surface to achieve stabilization of the surface of the substrate and silicide reaction. That is, right after the etch process using the photoresist film PR as a mask, the structure is put into a furnace to perform the annealing process.

The annealing process is performed in the presence of $O_2$ and $N_2$ to restore damage of gate oxide film 2 caused by the etching process used to pattern the gate electrode 3a. More specifically, if an oxide film is used as the gate insulating film between the gate electrode 3a and the substrate 1, the annealing process is performed in the presence of $O_2$. Otherwise, if a nitride film is used as the gate insulating film, it is performed in the presence of $N_2$.

That is, an oxide film or a nitride film (not shown) is formed between the gate electrode 3a and the $WSi_x$ film 4 by bonding silicon atoms of the gate electrode 3a with $O_2$ or $N_2$ passing through the grain boundary of the $WSi_x$ film 4 while the annealing process is being performed in the presence of O or N, or while the $WSi_x$ film 4, which is a refractory metal, and the cap oxide film 5 are being formed.

The above described silicide reaction process is performed to form the polycide, thereby realizing a low resistance of the gate electrode 3a by improving the adhesion of gate electrode 3a and the $WSi_x$ film 4.

Figure 1D:
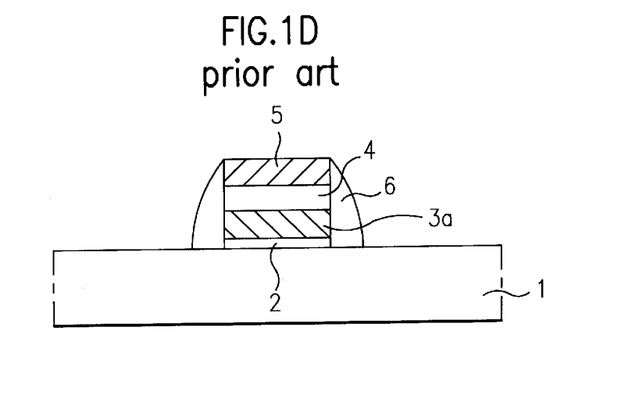

Referring to FIG. 1D, a CVD oxide film is deposited by a CVD (chemical vapor deposition) process on the entire surface including the cap oxide film 5. The CVD oxide film is then etched-back by an RIE (reactive ion etch) process, thereby forming sidewall spacers 6 on both sides of the cap oxide film 5, the $WSi_x$ film 4, the gate electrode 3a, and the gate oxide film 2.

As described above, the conventional electrode having a polycide structure (gate electrode 3a+$WSi_x$ film 4) is protected by the cap oxide film 5 and the sidewall spacers 6 made of a CVD oxide film.

Figure 2:
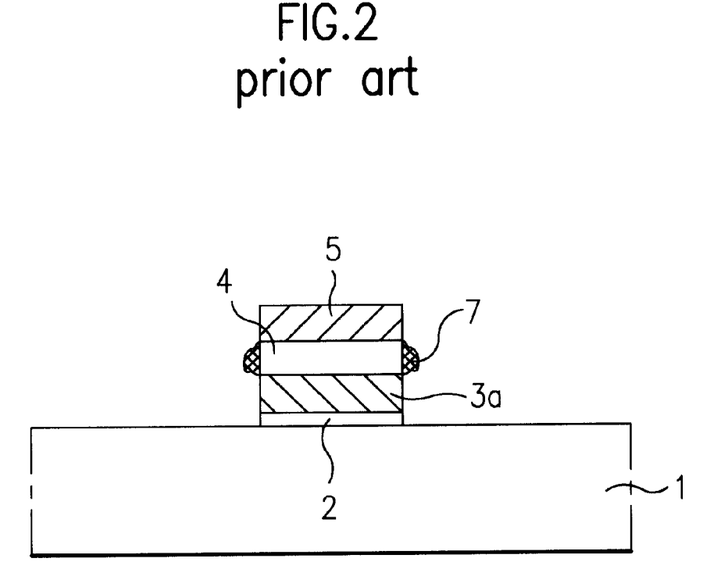
FIG. 2 is a cross-sectional view of a structure showing abnormal oxidation in forming an electrode of a conventional semiconductor device.

FIG. 2 is a cross-sectional view of a structure showing abnormal oxidation in forming an electrode of a conventional semiconductor device.

The abnormal oxidation is generated when an etch process to form the gate electrode 3a is performed using the patterned photoresist film PR as a mask to selectively remove the cap oxide film 5, the $WSi_x$ film 4, the doped polysilicon layer 3, and the gate oxide film 2, or when the whole structure is being moved to a furnace for silicide reaction.

To etch using the photoresist film PR as a mask, a liquid etchant such as $H2PO_2$ or $H_2O_2$ is used. A cleaning process is then performed to clean the etchant. A presence of $O_2$ is generated around the $WSi_x$ film 4 because the etchant contains $O_2$. Because of this $O_2$ presence, a material having $O_2$ is produced on sides; of the $WSi_x$ film 4.

Also, while the whole structure is being moved to the furnace to improve the adhesion of the $WSi_x$ film 4 and the gate electrode 3a via annealing, it is exposed to the O2 presence so that a material including $O_2$ is formed on sides of the $WSi_x$ film 4. This material, including $O_2$, is bonded to tungsten in $WSi_x$ film 4 during the annealing process for silicide reaction so that an abnormal oxide film 7, including tungsten atoms, is generated on sides of the $WSi_x$ film 4. This is generated during the annealing process using the $O_2$ presence for recovering the damage of the gate oxide film 2.

Figure 3:
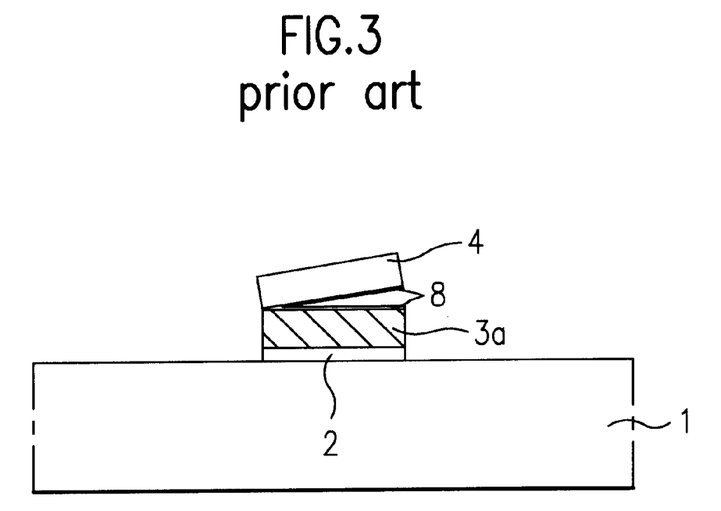
FIG. 3 is a cross-sectional view of a structure showing a peeling in forming an electrode of a conventional semiconductor device.

FIG. 3 is a cross-sectional view of a structure showing a peeling 8 in forming an electrode of a conventional semiconductor device. This peeling 8 is generated at the interface of gate electrode 3a and $WSi_x$ 4, which is a refractory metal silicide.

This peeling 8 is generated by bonding silicon atoms in the gate electrode 3a and nitride atoms or oxygen atoms passing through the grain boundary of the $WSi_x$ film 4 during the annealing process in the presence of $N_2$ or $O_2$. That is, since a thin nitride or oxide film is formed at the interface of the $WSi_x$ film 4 and the gate electrode 3a by bonding silicon atoms and either nitrogen atoms or oxygen atoms, the bond between the $WSi_x$ film 4 and the gate electrode 3a becomes weakened, thereby generating the peeling 8 at that interface.

As described in FIGS. 2 and 3, an abnormal oxide film is generated on sides of the $WSi_x$ film and the peeling is generated at the interface of the $WSi_x$ film and the gate electrode when a $WSi_x$ film is formed on a gate electrode to improve the performance of an electrode, or when a refractory metal layer such as W, a refractory silicide such as $TiSi_2$ or $COSi_2$, or a refractory nitride metal layer such as TiN is used to form an electrode.

The conventional method for forming an electrode passivation film of a semiconductor device has the following problems.

First, though a polycide structure is adopted to improve the performance of an electrode, silicide reaction on the side of a silicide film formed on a gate electrode is generated and an abnormal oxide film is formed by bondage with oxygen atoms in an etching process, thereby damaging the silicide film. Thus, the reliability is deteriorated. Further, since the abnormal oxide film is used as a mask in an ion-implanting process, this process may be inexactly performed and the reliability may become inferior.

Furthermore, since the silicide film is formed on the gate electrode, silicon atoms in the gate electrode and either oxygen or nitrogen are bonded in an annealing process in the presence of $N_2$ or $O_2$ to form a cap oxide film on the silicide film. As a result, peeling at the interface of the silicide film and the gate electrode is generated, and thus the yield and reliability of semiconductor device are deteriorated.

SUMMARY OF THE INVENTION

The present invention is directed to an electrode passivation layer of a semiconductor device and a method for forming the same that substantially obviates one or more of problems due to limitations and disadvantages of the related art.

An object of the invention is to provide an electrode passivation layer of a semiconductor device and a method for forming the same in which a diffusion preventing film and a passivation layer are formed at the interface of a gate electrode and a silicide film, on the silicide film, and on the sides of the silicide film to prevent abnormal oxidation or peeling, thereby improving the characteristics of oxidation-resistance and etch-resistance.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the electrode passivation film of a semiconductor device includes a semiconductor substrate; a conductive layer pattern formed on the semiconductor substrate; and an amorphous passivation film formed on the conductive layer pattern.

In another aspect of the invention, a method for forming an electrode passivation film of a semiconductor device includes the steps of preparing a semiconductor substrate; forming a conductive layer pattern on the semiconductor substrate; and forming an amorphous passivation film on the conductive layer pattern.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 4A to 4H are cross-sectional views showing process steps of a method for forming an electrode passivation layer of a semiconductor device according to the first embodiment of the present invention.

Figure 4A:
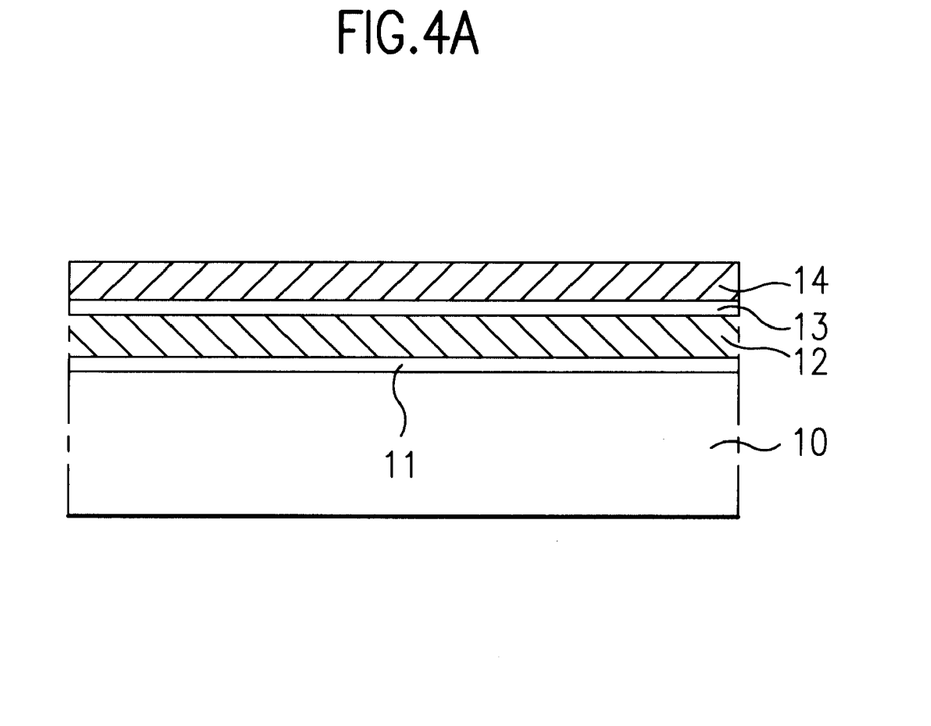
FIGS. 4A to 4H are cross-sectional views showing process steps of a method for forming an electrode passivation layer of a semiconductor device according to a first embodiment of the present invention.

As shown in FIG. 4A, a gate insulating film 11, a doped polysilicon layer 12, a diffusion preventing layer 13, and a tungsten film 14 are successively formed on a semiconductor substrate 10. The doped polysilicon layer 12 is doped with B, As, or P. The diffusion preventing film 13 is used to prevent chemical bonding between silicon atoms in the doped polysilicon layer 12 and the tungsten atoms in the tungsten film 14 at the interface. The diffusion preventing film 13 is formed of a conductive material, preferably of a WSiN film. The WSiN film is formed with a sputtering method to have a thickness of 40–60 Angstroms by using $W_5Si_3$ as a target, in the presence of Ar containing 20% of $N_2$ a refractory metal silicide layer such as $TiSi_5$, $CoSi_5$, or $TaSi_5$, or a refractory nitride metal layer such as TiN, ZrN, HfN, or TaN.

The film 14 is formed of a refractory metal such as Tungsten to have a thickness of 800–1200 Angstroms. Film 14 may also be formed.

Figure 4B:
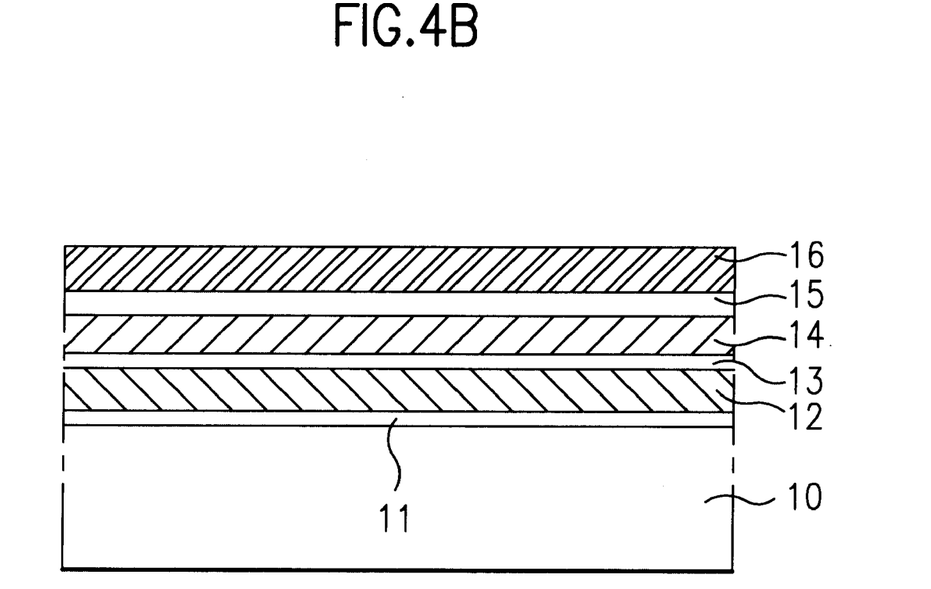

Referring to FIG. 4B, first and second insulating films 15 and 16 are successively formed on the tungsten film 14 with a CVD (chemical vapor deposition) method. The first insulating film 15 is made of a nitride film and has a thickness of 200–400 Angstroms, and the second insulating film 16 is made of an oxide film and has a thickness of 1200–1800 Angstroms. Low pressure chemical vapor deposition (LPCVD) equipment is used to form the first and second insulating films 15 and 16. When a wafer, loaded to CVD equipment, is being moved to a place where a temperature is set to be about 800° C., or when being unloaded after an annealing process, the contact with $O_2$ is blocked. Oxidation reaction with the tungsten film 14 is blocked so that the generation of an abnormal oxide film can be prevented.

Figure 4C:
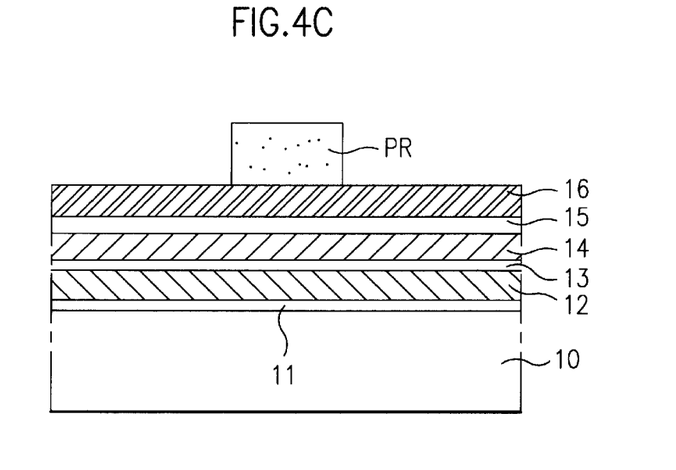

Referring to FIG. 4C, a photoresist film PR is coated on the second insulating film 16. The photoresist film PR is then subjected to an exposure and development process to define an electrode region so that the photoresist film PR remains over only the electrode region.

Figure 4D:
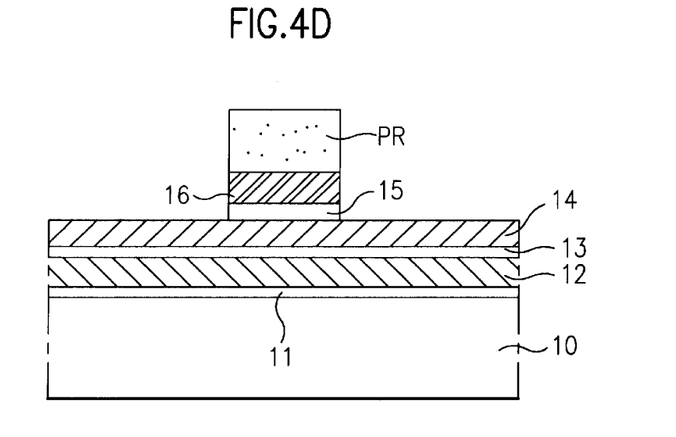

Referring to FIG. 4D, the second and first insulating films 16 and 15 are selectively removed with the patterned photoresist film PR serving as a mask.

Figure 4E:
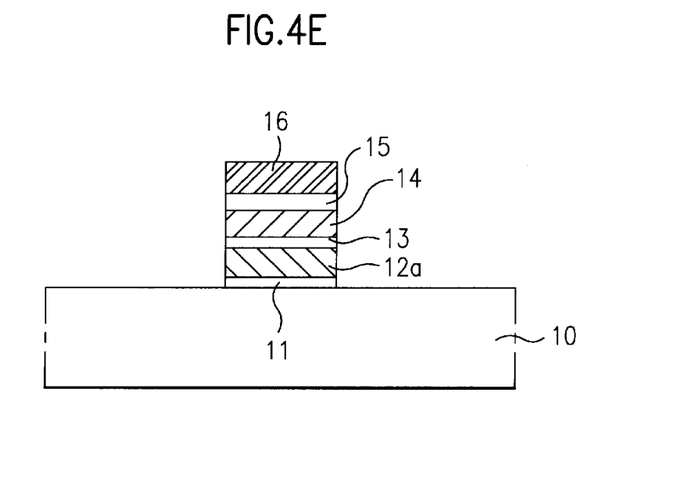

Referring to FIG. 4E, the remaining photoresist film PR is removed. Then, the first and second insulating films 15 and 16 serve as masks to selectively remove the tungsten film 14, the diffusion preventing film 13, the doped polysilicon layer 12, and the gate insulating film 11, thereby successively forming gate insulating film 11, gate electrode 12a, diffusion preventing film 13, and tungsten film 14, where electrode 12a and film 13 and 14 constitute a conductive layer pattern 19. The tungsten film 14 and the doped polysilicon layer 12 are removed in the presence of, e.g., $SF_6$ containing fluorine gas. That is, the conductive layer pattern 19 is formed including one of a polysilicon layer, a refractory metal layer and at least one of a refractory metal silicide layer and a refractory nitride metal layer.

Figure 4F:
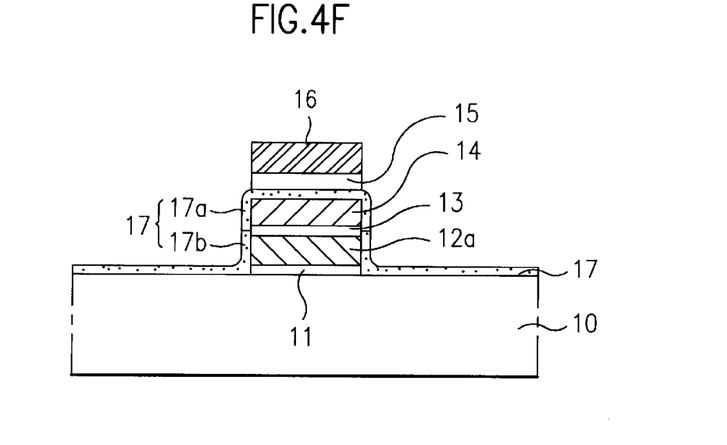

Referring to FIG. 4F, the whole substrate is annealed at a temperature of lower than 300° C. in the presence of $N_2$ for 80–120 seconds using ECR (electron-cyclotron-resonance) equipment. Thus, a passivation film 17 is formed at the interface of the first insulating film 15 and the tungsten film 14 and on the sides of the tungsten film 14 and the gate electrode 12a. The passivation film 17 is also formed on the substrate 10. The passivation film 17 is formed of amorphous nitride to have a thickness of 20–50 Angstroms.

The ECR equipment for accelerating ions to destroy ions is a kind of CVD equipment combining high activation of plasma and shocking effects of ions and electrons for promoting low temperature deposition.

The passivation film 17 is an amorphous WNx film 17a, which is formed at the interface of the tungsten film 14 and the first insulating film 15 by bonding tungsten of the film 14 and $N_2$ of the first insulating film 15. The WNx film 17a is also formed on the sides of the tungsten film 14 by annealing the tungsten film 14 in the presence of $N_2$.

In addition, an amorphous $Si_3N_4$ film 17b is formed on sides of the gate electrode 12a by a chemical reaction between silicon of the gate electrode 12a made of polysilicon and $N_2$. At this time, x in $WN_x$ film 17a is 0<x<1.

Instead of the tungsten film 14, a refractory metal silicide such as $TiSi_2$, $CoSi_2$, or $TaSi_2$, or a refractory nitride metal such as TiN, ZrN, HfN, or TaN may be formed on the gate electrode 12a as a polycide. In case it is used as a material for wires, a passivation film 17 having identical characteristics can be formed under identical conditions of processing. If a refractory metal silicide or a refractory nitride metal is formed instead of tungsten, a metal nitride film such as $MN_x$ (metal nitride film) is formed on sides of the refractory metal silicide or the refractory nitride metal and at the interface of the first insulating film 15 and either of them. x in $MN_x$ film is 0<x<1.

The nitride film ($MN_x$, $Si_3N_4$ film) has the amorphous characteristic and thus has chemical corrosion-resistance and oxidation-resistance so that it stands at a temperature of up to 750° C. in the presence of $O_2$.

Figure 4G:
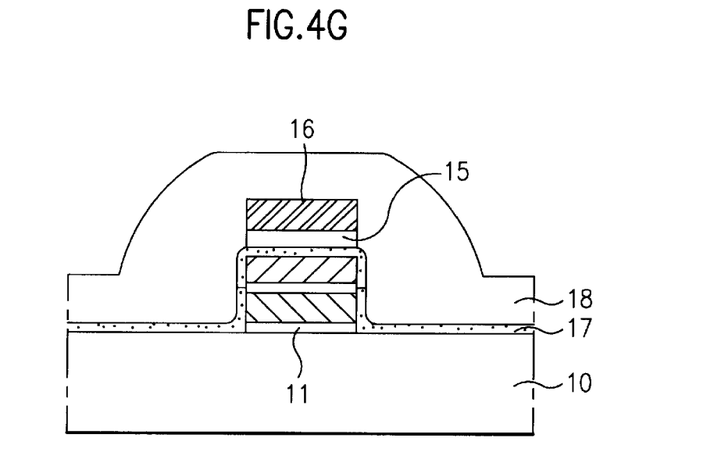

Referring to FIG. 4G, a third insulating film 18 is formed on the entire surface of the passivation film 17 and the second insulating film 16. The third film 18 is made of either a nitride film or an oxide film. If it is made to be an oxide film, TEOS (tetra-ethyl-orthosilicate) is used.

Figure 4H:
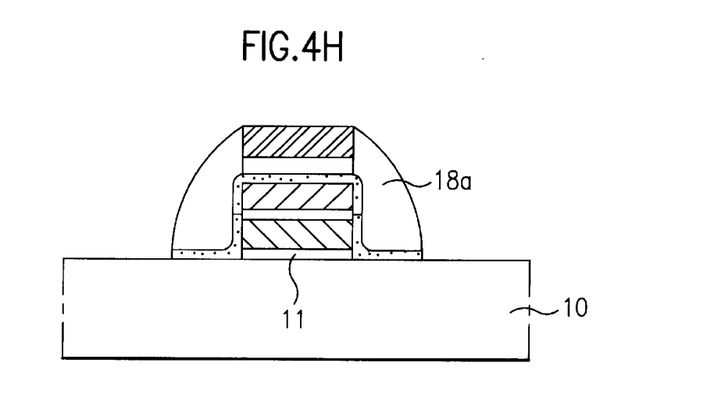

Referring to FIG. 4H, the third insulating film 18 is etched-back with an RIE (reactive ion etch) process so that sidewall spacers 18a are formed on the sides of the second and first insulating films 16 and 15 and the passivation film 17. At this time, the passivation film 17 is partially removed that the passivation film 17 below the sidewall spacers 18a remains.

Returning to FIG. 4F, a cross-sectional view of an electrode passivation layer is shown according to a first embodiment of the present invention. An electrode passivation film of a semiconductor device includes a semiconductor substrate 10, a conductive layer pattern 19 formed on the semiconductor substrate 10, and an amorphous passivation film 17 formed on the conductive layer pattern 19.

At this time, the conductive layer pattern 19 is formed including any one of a refractory silicon layer, a refractory metal layer, a refractory metal silicide layer, and a refractory nitride metal layer. It is preferable that a gate electrode 12a, a diffusion preventing film 13, a refractory metal film 14 made of, e.g. tungsten are successively formed to form the conductive layer pattern 19. The polysilicon layer is doped with any one of boron, phosphor, and arsenic. A gate insulating film 11 is formed between the conductive layer pattern 19 and the substrate 10.

The refractory metal layer is made of, e.g., tungsten to have a thickness of 800–1200 Angstroms. The refractory metal silicide layer is formed of $TiSi_2$, $CoSi_2$ or $Tasi_2$. The refractory nitride metal layer is formed of TiN, ZrN, HfN, or TaN.

The diffusion preventing film 13 is formed of a conductive material, preferably having a thickness of 40–60 Angstroms. Diffusion preventing film 13 is used to prevent silicon atoms in the gate electrode 12a and tungsten atoms in the tungsten film 14 at the interface when the tungsten film 14 from chemically bonding is formed right on the gate electrode 12a.

The amorphous passivation film 17 is formed of one or more than one of $MN_x$ (metal nitride), $MO_x$ (metal oxide), $Si_3N_4$, an amorphous oxide film, and an amorphous doped oxide film. x in $MN_x$ is in a range of $0<x<1$. x in $MO_x$ is in a range of $0<x<1$. The amorphous oxide film is $SiO_2$. The amorphous doped oxide film is formed of $B_2O_3$, $P_2O_5$, or $As_2O_3$. The amorphous passivation film 17 can prevent the formation of an abnormal oxide film because it blocks the direct contact of $O_2$ and the conductive layer pattern 19.

The amorphous passivation film 17 is formed on the conductive layer pattern 19. First and second insulating films 15 and 16 are additionally formed of a nitride film and an oxide film, respectively. They are used to protect and insulate the conductive layer pattern 19.

Another insulating film is additionally formed on the amorphous passivation film 17 and the first and second insulating films 15 and 16. Sidewall spacers 18a are additionally formed on both sides of the first and second insulating films and the amorphous passivation film 17 formed on both sides of the conductive layer pattern 19. The insulating film forming the sidewall spacer 18a is formed of TEOS (tetra-ethyl-orthosilicate).

Figure 5:
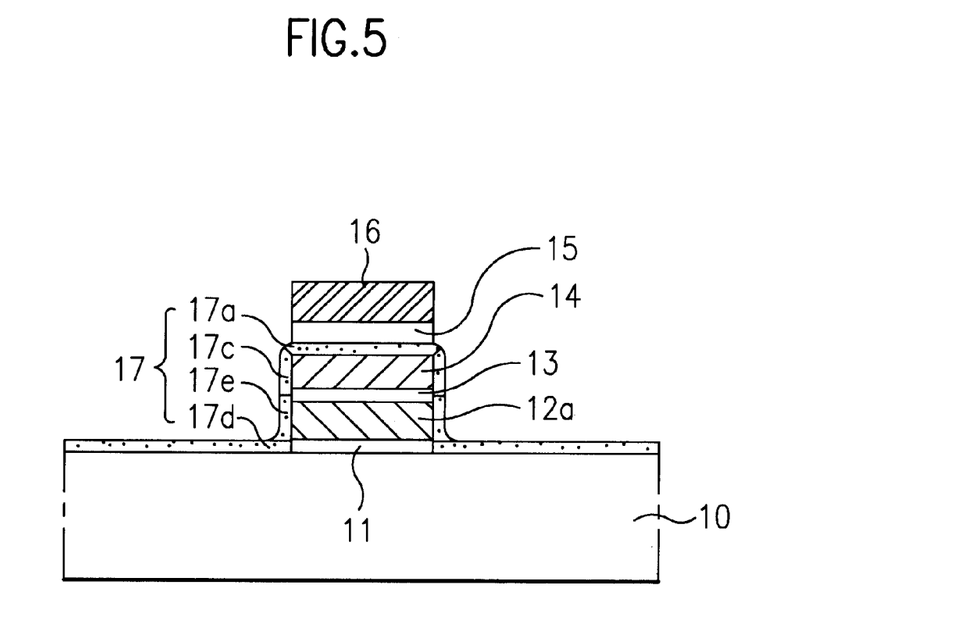
FIG. 5 is a cross-sectional view showing a structure of the electrode passivation layer shown in FIG. 4F according to a second embodiment of the present: invention.

FIG. 5 is a cross-sectional view showing a structure of the electrode passivation layer shown in FIG. 4F according to the second embodiment of the present invention. The steps leading to the structure shown by FIG. 5 and the steps performed on the structure shown by FIG. 5 are identical with those of FIGS. 4A through 4E and FIGS. 4G through 4F, respectively.

According to the second embodiment, the whole structure is annealed in of $O_2$ for 120 seconds at a temperature of lower than 300° C. using ECR equipment after completing the patterning process for a conductive pattern layer 19. Consequently, a passivation film 17 is formed at the interface of a tungsten film 14 and a first insulating film 15, and on the sides of the tungsten film 14 and the gate electrode 12a. The passivation film 17 is also formed on a semiconductor substrate 10.

At this time, the passivation film 17 formed at the interface of the tungsten film 14 and the first insulating film 15 is an amorphous $WN_x$ film 17a. The passivation film 17 formed on the sides of the tungsten film 14 is a $WO_x$ film 17c. The passivation film 17 formed on the semiconductor substrate 10 is an amorphous oxide film ($SiO_2$) 17d if the substrate 10 is made of silicon. The passivation film 17 formed on the sides of the gate electrode 12a is an amorphous doped oxide film ($B_2O_3$, $P_2O_5$, or $As_2O_3$) 17e including the impurity doped in the polysilicon layer.

The $WN_x$ film 17a, the $WO_x$ film 17c, the amorphous oxide film 17d, and the amorphous doped oxide film 17e all have good protecting characteristics with regard to corrosion-resistance and oxidation-resistance. The amorphous doped oxide film ($B_2O_3$, $P_2O_5$, or $As_2O_3$) 17e serves as a blocking layer concerning the diffusion of $O_2$. Accordingly, in the following process of annealing including oxygen, the tungsten film 14 is protected from oxidation.

Figure 6:
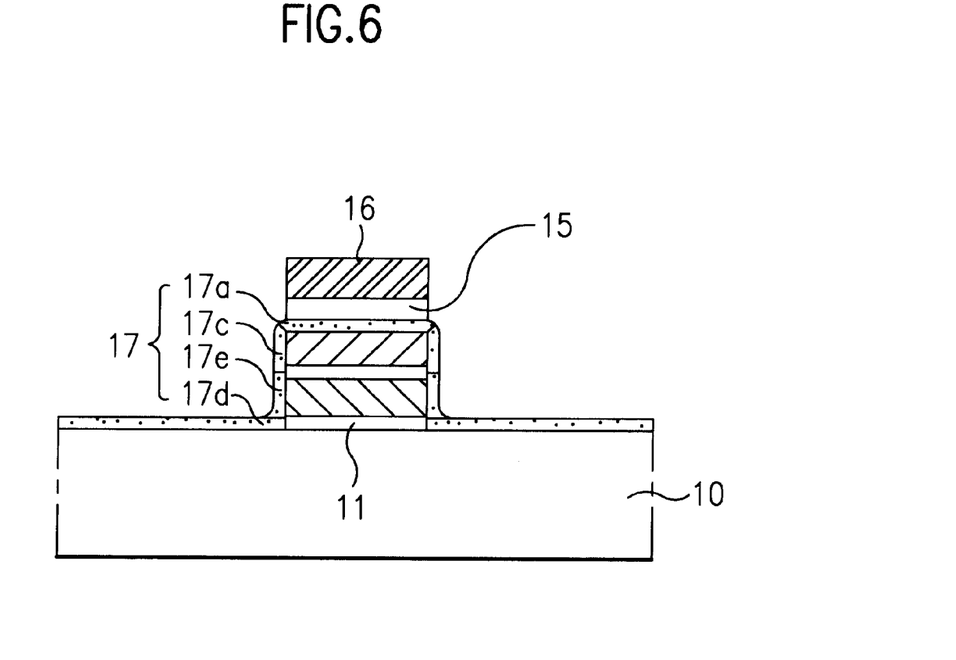
FIG. 6 is a cross-sectional view showing at structure of the electrode passivation layer shown in FIG. 4F according to a third embodiment of the present invention.

FIG. 6 is a cross-sectional view showing a structure of the electrode passivation layer shown in FIG. 4F according to the third embodiment of the present invention. The steps leading to the structure shown by FIG. 6 and the steps performed on the structure shown by FIG. 6 are identical with those of FIGS. 4A through 4E and FIGS. 4G through 4H, respectively.

According to the third embodiment, after finishing the patterning process for forming the conductive layer pattern 19, the whole substrate is subjected to an RTA (rapid thermal annealing) process in the presence of $N_2$ containing 10% of $O_2$, at a temperature of lower than 500° C. Thus, a passivation film 17 is formed at the interface of the tungsten film 14 and the first insulating film 15, and on the sides of the tungsten film 14 and the gate electrode 12a. The passivation film 17 is also formed on the semiconductor substrate 10.

At this time, the passivation film 17 positioned at the interface of the tungsten film 14 and the first insulating film 15 is a $WN_x$ film 17a. The passivation film 17e formed on the sides of the tungsten film 14 is WOx film 17c. The passivation film 17 formed on the semiconductor substrate 10 is an amorphous oxide film ($SiO_2$) 17d if the substrate 10 is made of silicon. The passivation film 17 formed on the sides of the gate electrode 12a is a doped oxide film ($B_2O_3$, $P_2O_5$, or $As_2O_3$) 17e including the impurity doped in the polysilicon layer.

Although the passivation film 17 is formed in the presence of 90% of $N_2$ and 10% of $O_2$, it reacts with $O_2$ more easily than $N_2$. Thus, the insulating film 17 such as the $WN_x$ film 17a, the $WO_x$ film 17c, the amorphous oxide film ($SiO_2$) 17d, or the amorphous doped oxide film ($B_2O_3$, $P_2O_5$, or $As_2O_3$) 17e is formed.

The doped oxide film ($B_2O_3$, $P_2O_5$, or $As_2O_3$) 17e is amorphous and functions as a blocking layer with regard to the diffusion of $O_2$ and protects the tungsten film 14 well. At this time, if a refractory metal silicide (e.g. $TiSi_2$, $CoSi_2$, or $TaSi_2$) is used instead of the tungsten film 14, $MO_x$ (metal oxide) is generated by bonding the refractory metal silicide and $O_2$. x in the $MO_x$ is $0<X<1$.

Figure 7:
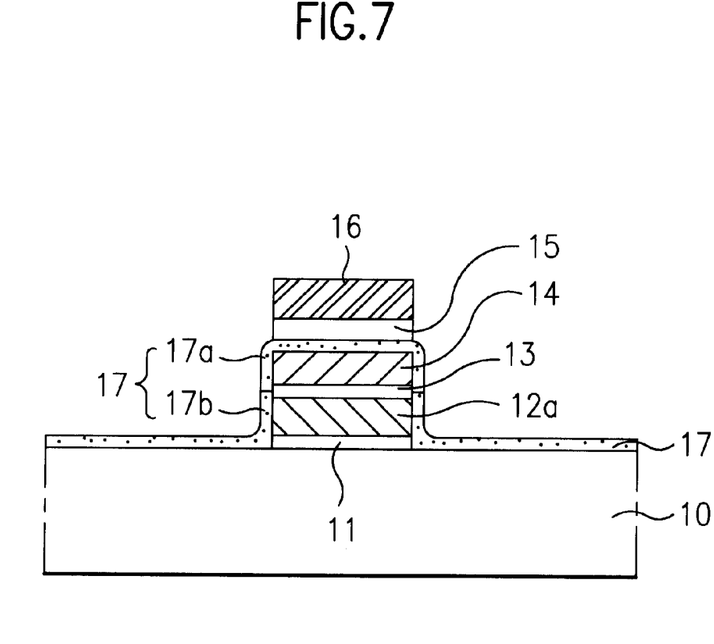
FIG. 7 is a cross-sectional view showing a structure of the electrode passivation layer shown in FIG. 4F, according to a fourth embodiment of the present invention.

FIG. 7 is a cross-sectional view showing a structure of the electrode passivation layer shown in FIG. 4F according to the fourth embodiment of the present invention.

The steps leading to the structure shown by of FIG. 7 and the steps performed on the structure shown by FIG. 7 are identical with those of FIGS. 4A through 4E and FIGS. 4G through 4H, respectively.

According to the fourth embodiment, after finishing the patterning process for forming the conductive layer pattern 19, the whole substrate is subjected to an annealing process in $NH_3$ at a temperature of 400–1000° C. for 25–35 minutes, so that a passivation film 17 is formed at the interface of the tungsten film 14 and the first insulating film 15 and on the sides of the tungsten film 14 and the gate electrode 12a. The passivation film 17 is also formed on the semiconductor substrate 10.

At this time, the passivation film 17 formed at the interface of the tungsten film 14 and the first nitride film 15 and on the sides of the tungsten film 14 is a $WN_x$ film 17a. The passivation film 17 formed on the semiconductor substrate 10 and on the sides of the gate electrode 12a is an amorphous $Si_3N_4$ film 17b.

When a passivation film 17 is formed in the presence of $NH_3$ at a temperature of lower than 800° C., a $WN_x$ film 17a formed on the tungsten film 14 is amorphous. This is detected by analyzing the passivation film 17 with a TEM (transmission electron microscope). On the contrary, when the passivation film 17 is formed at a temperature of higher than 800° C., the $WN_x$ film formed on the tungsten film 14 is crystal.

The crystal $WN_x$ film 17a is brittle. Therefore, its interface is cracked if exposed to high heat in the heat cycle, causing its characteristics as a passivation film to be deteriorated. To avoid such problems, the annealing process in a furnace must be performed at a temperature of lower than 800° C. The crystal $WN_x$ film analyzed with an XPS (X-ray photoelectron spectroscopy), where x in the amorphous $WN_x$ film 17a is $0<x<1$.

Figure 8:
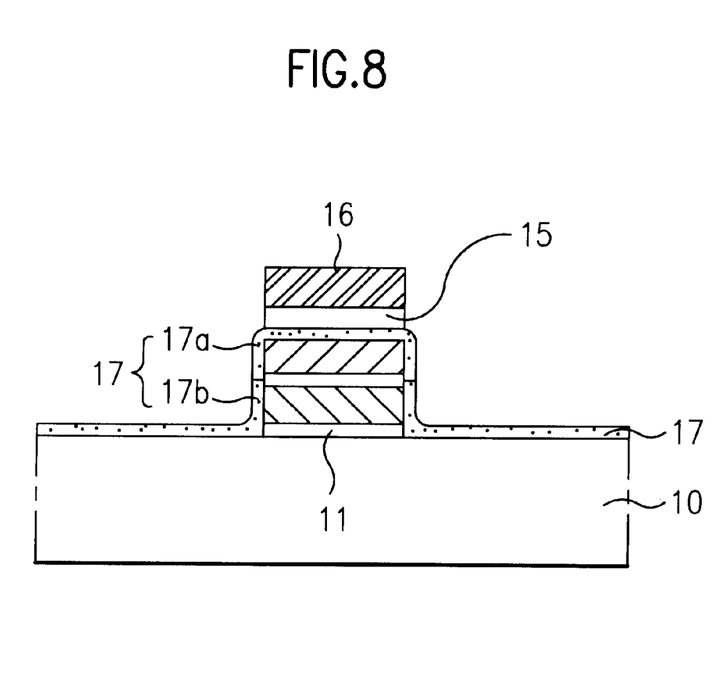
FIG. 8 is a cross-sectional view showing a structure of the electrode passivation layer showing in FIG. 4F, according to a fifth embodiment of the present invention.

FIG. 8 is a cross-sectional view showing a structure of the electrode passivation layer showing in FIG. 4F according to the fifth embodiment of the present invention. The steps leading to the structure shown by of FIG. 8 and the steps performed on the structure shown by FIG. 8 are identical with those of FIGS. 4A through 4E and FIGS. 4G through 4H, respectively.

According to the fifth embodiment, after finishing the patterning process for forming the conductive layer pattern 19, the whole substrate is subjected to an RTA (rapid thermal annealing) process in $NH_3$. Thus, a passivation film 17 is formed at the interface of the tungsten film 14 and the first insulating film 15, and on the sides of the gate electrode 12a. The passivation film 17 is also formed on the semiconductor substrate 10.

The passivation film 17 formed at the interface of the tungsten film 14 and the first insulating film 15, and on the sides of the gate electrode 12a, is a $WN_x$ film 17a. The passivation film 17 formed on the semiconductor substrate 10 is a $Si_3N_4$ film 17b. The $WN_x$ film 17a remains amorphous at a temperature of up to 1000° C. and thus has its corrosion-resistance and oxidation-resistance as a passivation film.

Instead of a tungsten film 14, a refractory metal silicide such as $TiSi_2$, $CoSi_2$, or $TaSi_2$, or a refractory nitride metal such as TiN, ZrN, HfN, or TaN, which is all used as a passivation film 17, has identical characteristics as a passivation film.

Thus, an $MN_x$ (metal nitride) film 17a is formed at the interface of the first insulating film 15 and the refractory metal silicide or the refractory nitride metal and on the sides of the refractory metal silicide or the refractory nitride metal. x in the $MN_x$ is $0<X<1$.

The nitride film ($MN_x$ (metal nitride), $Si_3N_4$ film) and the oxide film ($MO_x$ (metal oxide), $SiO_2$, $B_2O_3$, $P_2O_5$, or $As_2O_3$) have the amorphous characteristic and thus have chemical corrosion-resistance and oxidation resistance.

According to the present invention, a refractory metal layer is formed on a polysilicon layer, and a diffusion-preventing layer is formed at their interface. If the electrode is formed of a polysilicon layer, and the refractory metal layer is a conductive layer such as a refractory metal silicide layer or a refractory nitride metal layer, the passivation film shown in FIGS. 4A to 4H, 5, 6, 7, and 8 can be formed.

An electrode passivation film of a semiconductor device and a forming method thereof have at least the following advantages. Since a diffusion-preventing film is formed at the interface of a gate electrode and a refractory metal (or, a refractory silicide, or a refractory metal nitride), generation of oxide films can be prevented. As a result, peeling can be prevented at the interface, enabling an electrode of a semiconductor device achieve enhanced productivity yield and reliability. Further, since an amorphous insulating film is formed as a passivation film covering a conductive layer pattern including a gate electrode, a diffusion-preventing film, and a refractory metal layer, the generation of an abnormal oxide film on the sides of the refractory metal layer can be prevented, enabling a semiconductor device to achieve good reliability. Furthermore, since an insulating film made of nitride is formed with LPCVD equipment on the tungsten film positioned on the diffusion-preventing film, the contact of oxygen and a refractory metal such as tungsten can be prevented during loading or unloading. Still further, since a patterning process for patterning a conductive layer pattern is performed in the presence of fluorine, oxygen does not contact the refractory metal and a passivation film is formed on the side of both the gate electrode and the refractory metal before an annealing process such as silicide reaction is performed, enabling an electrode of a semiconductor device with good corrosion-resistance and oxidation-resistance to achieve regard to oxygen.

It will be apparent to those skilled in the art that various modification and variations can be made in the electrode passivation layer of a semiconductor device and the method for forming the same of the present invention without departing from the spirit or scope of the inventions. Thus, it is intended that the present invention cover the modifications and variations of this invention provided they come within the scope of the appended claims and their equivalents.

What is claimed is:

1. A method for forming an electrode passivation film of a semiconductor device, the method comprising:
    forming a conductive layer pattern on the semiconductor substrate; and
    forming an amorphous passivation film on sides of the conductive layer pattern, wherein the amorphous passivation film is composed of multiple segments that make up a single layer directly contacting sides of the conductive layer pattern.

2. The method as recited in claim 1, wherein the conductive layer pattern includes at least one of a polysilicon layer, a refractory metal layer, a refractory metal silicide layer, and a refractory nitride metal layer.

3. The method as recited in claim 2, wherein the polysilicon layer is a doped polysilicon layer including any one of boron, phosphor, and arsenic.

4. The method as recited in claim 2, wherein the refractory metal layer includes tungsten.

5. The method as recited in claim 4, wherein the tungsten is formed to have a thickness of 800–1200 Angstroms.

6. The method as recited in claim 2, wherein the refractory metal silicide layer includes one of $TiSi_2$, $CoSi_2$, and $TaSi_2$.

7. The method as recited in claim 2, wherein the refractory nitride metal layer includes one of TiN, ZrN, HfN, and TaN.

8. The method as recited in claim 1, wherein the conductive layer pattern is formed by successive formation of a polysilicon layer, a diffusion-preventing film, and a refractory metal layer.

9. The method as recited in claim 8, wherein the diffusion-preventing film is formed of a conductive material.

10. The method as recited in claim 9, wherein the diffusion-preventing film includes WSiN.

11. The method as recited in claim 10, wherein the WSiN is formed 40–60 Angstroms thick.

12. The method as claimed in claim 1, wherein the amorphous passivation film is formed in presence of gases of at least one of $N_2$ and $O_2$.

13. The method as claimed in claim 12, wherein the amorphous passivation film is formed including the conductive layer pattern in the presence of gases of at least one of $N_2$ and $O_2$.

14. The method as recited in claim 13, wherein the amorphous passivation film is formed of at least one of $MN_x$ (metal nitride), $MO_x$ (metal oxide), $Si_3N_4$, an amorphous oxide film, and an amorphous doped oxide film.

15. The method as recited in claim 14, wherein a range of x in the $MN_x$ is 0<x<1, and a range of x in the $MO_x$ is 0<x<1.

16. The method as recited in claim 14, wherein the amorphous oxide film is $SiO_2$.

17. The method as recited in claim 14, wherein the amorphous doped oxide film is one of $B_2O_3$, $P_2O_5$ and $As_2O_3$.

18. The method as recited in claim 12, wherein the forming of the amorphous passivation film comprises:
performing an annealing process in the presence of $N_2$ or $O_2$, at a temperature of lower than 300° C., for 120 seconds.

19. The method as recited in claim 12, wherein the forming of the amorphous passivation film comprises:
performing an RTA (rapid thermal annealing) process in the presence of a mixed gas of $N_2$ and $O_2$ at a temperature of lower than 500° C.

20. The method as recited in claim 19, wherein the mixed gas is $N_2$ including 10% $O_2$.

21. The method as recited in claim 1, wherein the amorphous passivation film is formed in the presence of $NH_3$.

22. The method as recited in claim 21, wherein the forming of the amorphous passivation film comprises:
performing an annealing process the presence of $NH_3$ at a temperature of 400–800° C. for 25–35 minutes.

23. The method as recited in claim 21, wherein the forming of the amorphous passivation film comprises:
performing an RTA process in the presence of $NH_3$ at a temperature of lower than 1000° C.

24. The method as recited in claim 1, wherein the amorphous passivation film is formed using cyclotron-resonance equipment.

25. The method as recited in claim 1, further comprising:
forming first and second insulating films on the conductive layer pattern.

26. The method as recited in claim 25, wherein the first and second insulating films include a nitride film and an oxide film, respectively.

27. The method as recited by claim 1, further comprising:
preparing the semiconductor substrate.

28. The method of claim 1, wherein the amorphous passivation film also extends over the conductive layer pattern.

29. The method of claim 1, wherein the amorphous passivation film also extends over at least a portion of a surface of the substrate.

30. A method for forming an electrode passivation film of a semiconductor device, the method comprising:
forming a conductive layer pattern on said semiconductor substrate, wherein said conductive layer pattern is made up of more than one conductive layer; and
forming an amorphous passivation film on said conductive layer pattern, wherein the amorphous passivation film is composed of multiple segments that make up a single layer directly contacting sides of the conductive layer pattern.

31. The method of claim 30, wherein the conductive layer pattern comprises at least two of a doped polysilicon layer, a refractory metal layer, and refractory metal silicide layer, and a refractory nitride metal layer.

32. The method of claim 31, wherein the refractory layer includes tungsten.

33. The method of claim 30, wherein the conductive layer pattern is formed by successive formation of a polysilicon layer, a diffusion-preventing film, and a refractory metal layer.

34. The method of claim 33, wherein the diffusion-preventing film is formed of a conductive material.

35. The method of claim 34, wherein the diffusion-preventing film includes WSiN.

* * * * *